(12) United States Patent
Okade et al.

(10) Patent No.: US 10,104,781 B2
(45) Date of Patent: Oct. 16, 2018

(54) PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

(71) Applicant: HITACHI CHEMICAL COMPANY, LTD., Tokyo (JP)

(72) Inventors: Shota Okade, Tokyo (JP); Masahiro Miyasaka, Tokyo (JP); Yukiko Muramatsu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/107,858

(22) PCT Filed: Dec. 22, 2014

(86) PCT No.: PCT/JP2014/083965
§ 371 (c)(1),
(2) Date: Jun. 23, 2016

(87) PCT Pub. No.: WO2015/098870
PCT Pub. Date: Jul. 2, 2015

(65) Prior Publication Data
US 2016/0330845 A1    Nov. 10, 2016

(30) Foreign Application Priority Data

Dec. 27, 2013  (JP) ................. 2013-271831

(51) Int. Cl.
| | | |
|---|---|---|
| *G03F 7/027* | (2006.01) | |
| *G03F 7/028* | (2006.01) | |
| *G03F 7/033* | (2006.01) | |
| *G03F 7/20* | (2006.01) | |

(Continued)

(52) U.S. Cl.
CPC ....... *H05K 3/0023* (2013.01); *C23C 18/1633* (2013.01); *C25D 3/12* (2013.01);
(Continued)

(58) Field of Classification Search
None
See application file for complete search history.

(56) References Cited

FOREIGN PATENT DOCUMENTS

| | | | |
|---|---|---|---|
| JP | 2002-323760 | * | 11/2002 |
| JP | 2005-301101 A | | 10/2005 |

(Continued)

OTHER PUBLICATIONS

Machine translation of JP 2012-198573 (2012).*

(Continued)

*Primary Examiner* — Martin J Angebranndt
(74) *Attorney, Agent, or Firm* — Fitch Even Tabin & Flannery, LLP

(57) ABSTRACT

A photosensitive resin composition includes a binder polymer, a photopolymerizable compound, and a photopolymerization initiator. The binder polymer has a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms. The photopolymerizable compound include a bisphenolic di(meth)acrylate having from 1 to 20 structural units of an ethyleneoxy group and having from 0 to 7 structural units of a propyleneoxy group.

10 Claims, 2 Drawing Sheets

(51) Int. Cl.
     *G03F 7/38*   (2006.01)
     *H05K 3/02*   (2006.01)
     *H05K 3/00*   (2006.01)
     *C23C 18/16*  (2006.01)
     *C25D 3/12*   (2006.01)
     *C25D 3/38*   (2006.01)
     *C25D 3/48*   (2006.01)
     *C25D 7/12*   (2006.01)
     *G03F 7/32*   (2006.01)
(52) U.S. Cl.
     CPC .............. *C25D 3/38* (2013.01); *C25D 3/48* (2013.01); *C25D 7/12* (2013.01); *G03F 7/027* (2013.01); *G03F 7/033* (2013.01); *G03F 7/2053* (2013.01); *G03F 7/322* (2013.01); *G03F 7/38* (2013.01)

(56)            References Cited

FOREIGN PATENT DOCUMENTS

| JP | 2006-145844   | * | 6/2006  |
| JP | 2006-293094 A |   | 10/2006 |
| JP | 2007-114452 A |   | 5/2007  |
| JP | 2007-122028 A |   | 5/2007  |
| JP | 2008-152285 A |   | 7/2008  |
| JP | 2012-198573 A |   | 10/2012 |
| JP | 2013-246387 A |   | 12/2013 |
| TW | 200622491 A   |   | 7/2006  |
| TW | 201224656 A   |   | 6/2012  |
| WO | 2006/035807 A1|   | 4/2006  |
| WO | 2008/078483 A1|   | 7/2008  |
| WO | 2010/098175 A1|   | 9/2010  |
| WO | 2010/098183 A1|   | 9/2010  |
| WO | 2012/067107 A1|   | 5/2012  |

OTHER PUBLICATIONS

Machine translation of JP 2008-152285 (2008).*
Machine translation of JP 2006-293094 (2006).*
Machine translation of JP 2007-122028 (2007).*
International Search Report for PCT/JP2014/083965 dated Feb. 10, 2015; English translation submitted herewith (5 Pages).
Written Opinion of the International Search Authority dated Feb. 10, 2015 (3 Pages).

* cited by examiner

PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2014/083965, filed Dec. 22, 2014, designating the United States, which claims priority from Japanese Patent Application No. 2013-271831, filed Dec. 27, 2013, which are hereby incorporated herein by reference in their entirety.

TECHNICAL FIELD

The present invention relates to a photosensitive resin composition, a photosensitive element, a method for forming a resist pattern, and a method for manufacturing a printed wiring board.

BACKGROUND ART

In the field of producing printed wiring boards, photosensitive resin compositions have been widely employed as resist materials used for etching or plating. The photosensitive resin composition is often used as a photosensitive element (layered product) provided with a support and a layer which is formed on the support using the photosensitive resin composition (hereinafter, sometimes referred to as "photosensitive resin composition layer").

For example, the printed wiring board is manufactured as follows. First, a photosensitive element having a support and a photosensitive resin composition layer is prepared, and the photosensitive resin composition layer of the photosensitive element is formed on a substrate for forming circuits (photosensitive layer forming process). Next, the predetermined area of the photosensitive resin composition layer is irradiated with active light rays to cure the exposed area (exposure process).

Then, the unexposed area is then removed (developed) from the substrate, thereby forming a resist pattern, which is the cured material of the photosensitive resin material (hereinafter, sometimes referred to as "resist cured product"), on the substrate (developing process). The resist pattern obtained is used for etching or plating to form a circuit on the substrate (circuit forming process), and finally the resist pattern is released and removed to manufacture a printed wiring board (releasing process).

As an method of exposure, a method in which exposure is carried out through a photomask using a mercury lamp as a light source is conventionally employed. Recently, an method of exposure called DLP (Digital Light Processing) or LDI (Laser Direct Imaging) has been proposed as a direct writing exposure method that allows direct formation of patterns without using a photomask based on digital data on the photosensitive resin composition layer. Such a direct writing method of exposure has improved alignment accuracy than the method of exposure through a photomask and allows the formation of finer patterns, and therefore increasingly used to manufacture substrates for high density package substrates.

In general, in the exposure process, the exposure time is desired to be reduced in order to improve the production efficiency. In the above direct writing method of exposure, however, monochromatic light such as laser is used as a light source and the substrate is irradiated with light rays while scanning. Therefore, the direct writing method of exposure tends to require a longer exposure time as compared to the conventional method of exposure carried out through a photomask. Accordingly, in order to reduce the exposure time to improve the production efficiency, it is necessary to improve the sensitivity of the photosensitive resin composition than the conventional one.

Meanwhile, in association with recent increase in density of printed wiring boards, the demand for a photosensitive resin composition that allows the formation of a resist pattern with sufficient resolution (resolution property) and adhesiveness is increasing. In particular, a photosensitive resin composition that allows the formation of a resist pattern having a L/S (line width/space width) of 10/10 (unit: μm) or less in manufacture of a package substrate is required.

In general, increase in resolution of the resist pattern is achieved by, for example, increasing the crosslink density after curing of the photosensitive resin composition. However, the resist pattern is hard and becomes fragile when the crosslink density in increased, and the problem of cracking of the resist pattern easily occurs in a conveyance process or the like. In order to solve this problem, the technique of increasing flexibility of the resist pattern is proposed. However, when the flexibility is increased, the resist pattern easily bends, which fact results in reduction in resolution property. Therefore, the features of increasing the resolution and flexibility are inconsistent with each other in the resulting resist pattern.

Moreover, in the developing process, it is necessary to shorten the time required for releasing the uncured photosensitive resin composition (sometimes referred to as "developing time"), so as to improve the production efficiency.

In order to meet these demands, various photosensitive resin compositions have been examined in the past. For example, a photosensitive resin composition in which the above required features are improved by using a specific binder polymer, a photopolymerizable compound, a photopolymerization initiator, and a sensitizing dye is disclosed in, for example, Japanese Patent Application Laid-Open (JP-A) Nos. 2005-301101, 2007-114452, and 2007-122028, and International Publication Nos. WO 08/07848, WO 10/098175, WO 10/098183, and WO 12/067107.

SUMMARY OF INVENTION

Technical Problem

However, there is still room for improvement of the conventional photosensitive resin composition, in order to achieve excellent flexibility while maintaining resolution and adhesiveness of the resulting resist pattern and to further improve the resolution.

The object of the present invention is to provide a photosensitive resin composition that allows the formation of a resist pattern satisfactory in terms of all of the properties of resolution, adhesiveness, and flexibility with excellent developability, a photosensitive element using the photosensitive resin composition, a method for forming a resist pattern, and a method for producing a printed wiring board.

Solution to Problem

The present inventors researched earnestly in order to solve the above-mentioned problems, and as a result, they accomplished the present invention by finding that a photosensitive resin composition that allows the formation of a resist pattern excellent in all of the properties of resolution, adhesiveness, and flexibility with excellent developability can be obtained by combining a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms and a photopolymerizable compound that has an ethyleneoxy group having from 1 to 20 structural units and a propyleneoxy group having from 0 to 7 structural units and has a bisphenolic structure and two ethylenically unsaturated bonds.

That is, a first embodiment of the present invention is a photosensitive resin composition including a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms, a photopolymerizable compound including a bisphenolic di(meth)acrylate having from 1 to 20 structural units of an ethyleneoxy group and having from 0 to 7 structural units of a propyleneoxy group, and a photopolymerization initiator.

Taking the above-mentioned embodiment by a photosensitive resin composition allows the formation of a resist pattern excellent in all the properties of resolution, adhesiveness, and flexibility with excellent developability. The above-mentioned photosensitive resin composition allows the formation of a resist pattern having an L/S (line width/space width) of 10/10 (unit: μm) or less.

A second embodiment of the present invention is a photosensitive element having a support and a photosensitive resin composition layer that is provided on the support and that is formed from the photosensitive resin composition according to the first embodiment. Use of such a photosensitive element allows efficient formation of a resist pattern excellent in especially resolution, adhesiveness, and flexibility with excellent developability.

A third embodiment of the present invention is a method for forming a resist pattern, the method comprising: forming a photosensitive resin composition layer on a substrate using the photosensitive resin composition according to the first embodiment; irradiating at least a part of an area of the photosensitive resin composition layer with active light rays and photo-curing the area to form a cured material area; and removing an area other than the cured material area of the photosensitive resin composition layer from the substrate to form a resist pattern, which is the cured material area, on the substrate. This method for forming a resist pattern allows efficient formation of a resist pattern excellent in all the properties of resolution, adhesiveness, and flexibility with excellent developability.

In the method for forming a resist pattern, the wavelength of the active light rays to be applied is preferably in a range of from 340 nm to 430 nm. This allows more efficient formation of a resist pattern better in resolution, adhesiveness, flexibility, and resist shape with excellent sensitivity and developability.

A fourth embodiment of the present invention is a method for producing a printed wiring board, the method including: subjecting the substrate, on which the resist pattern has been formed using the above-mentioned method for forming a resist pattern, to at least one of etching or plating. This producing method allows efficient manufacture of a printed wiring board having wiring with an increased density such as a high density package substrate, with excellent accuracy and excellent production efficiency.

Advantageous Effects of Invention

According to the present invention, there can be provided a photosensitive resin composition that allows the formation of a resist pattern satisfactory in terms of all of the properties of resolution, adhesiveness, and flexibility with excellent developability; a photosensitive element prepared using the photosensitive resin composition; a method for forming a resist pattern; and a method for producing a printed wiring board.

DESCRIPTION OF EMBODIMENTS

Figure 1:
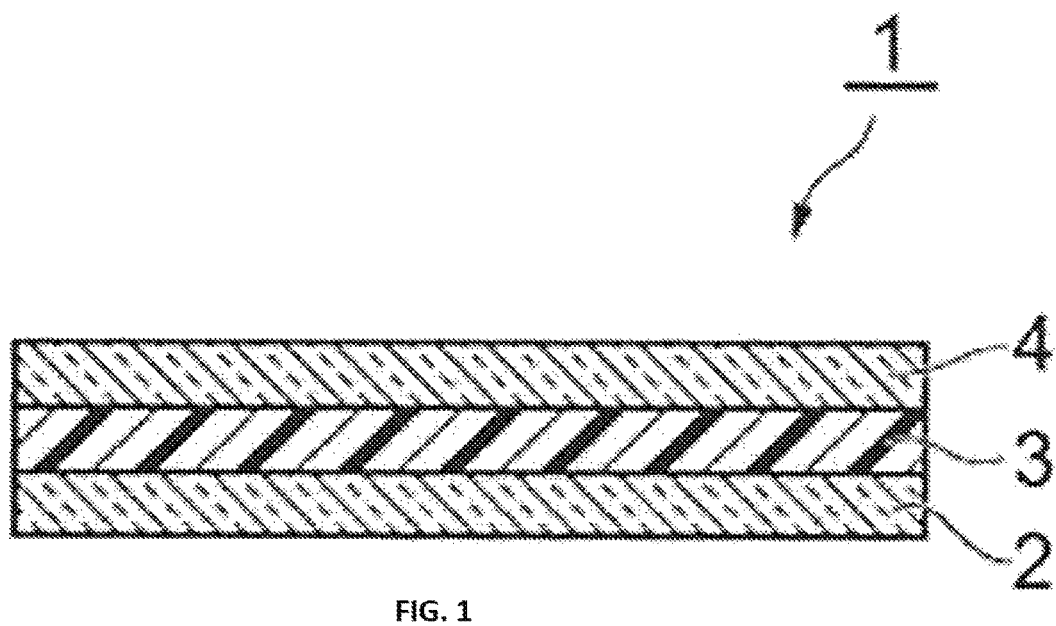
FIG. 1 is a schematic cross sectional view illustrating an embodiment of a photosensitive element according to the present invention.

Embodiments to implement the present invention are described in detail. However, the present invention is not limited to the following embodiments. In addition, in the following embodiments, their constituents (also including constituent steps) are not necessarily essential unless otherwise clearly indicated or they are considered to be in principle clearly essential. This is true for numerical values and ranges and does not unfairly limit the present invention.

As used herein, the term "(meth)acrylic acid" means acrylic acid or methacrylic acid, the term "(meth)acrylate" means an acrylate or a corresponding thereto methacrylate, and the term "(meth)acryloyloxy group" means an acryloyloxy group or a methacryloyloxy group. The term "(poly) ethyleneoxy" as used herein means at least one of an ethyleneoxy group or a polyethyleneoxy group in which two or more ethylene groups are linked via an ether bond. The ethyleneoxy group is a group represented by ($-CH_2CH_2-O-$), and also referred to as "oxyethylene group" or "ethylene oxide". The term "(poly)propyleneoxy group" as used herein means at least one of a propyleneoxy group or a polypropyleneoxy group in which two or more propylene groups are linked via an ether bond. The propyleneoxy group is a group represented by ($-CHCH_3CH_2-O-$), a group represented by ($-CH_2CHCH_3-O-$), or a group represented by ($-CH_2CH_2CH_2-O-$), and also referred to as "oxypropylene group" or "propylene oxide". The term "EO-modified" compound means a compound having a (poly)ethyleneoxy group; "PO-modified" compound means a compound having a (poly)propyleneoxy group; and "EO, PO-modified" compound means a compound having both a (poly)ethyleneoxy group and a (poly)propyleneoxy group.

The term "process" as used herein indicates not only a separate process but also a process that is not clearly distinguished from other processes as long as the desired effect of the process is obtained therefrom. In the present specification, each numerical range specified using "(from) . . . to . . . " represents a range including the numerical values noted before and after "to" as the minimum value and the maximum value, respectively. Furthermore, when plural kinds of substances that correspond to the same component exist in the composition, the amount of the component in the composition refers to the total mass of the plural kinds of substances unless otherwise specified. The term "layer" as used herein indicates not only a structure having a shape formed on a whole surface but also a structure having a shape formed on a part of a surface when observed in a plane view. The term "layered" as used herein indicates "provided on or above", in which two or more layers may be linked or detachable.

Photosensitive Resin Composition

The photosensitive resin composition of the present embodiment includes component (A): a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms; component (B): a photopolymerizable compound including a bisphenolic di(meth)acrylate having from 1 to 20 structural units of an ethyleneoxy group and having from 0 to 7 structural units of the above-mentioned propyleneoxy group; and component (C): a photopolymerization initiator. The photosensitive resin composition may further include other components, if necessary.

The inclusion of the binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms and the bisphenolic di(meth)acrylate having from 1 to 20 structural units of an ethyleneoxy group and having from 0 to 7 structural units of a propyleneoxy group as a photopolymerizable compound allows constitution of a photosensitive resin composition that allows the formation of a resist pattern excellent in all the properties of resolution, adhesiveness, and flexibility with excellent developability. The specific reason for the above-mentioned effect is not entirely clear, but is thought to be as follows. It is presumed that the inclusion of a structural unit derived from a hydroxyalkyl (meth)acrylate ester having a hydroxyalkyl group having from 1 to 12 carbon atoms, which has excellent pliability, in addition to a structural unit derived from styrene or α-methylstyrene, which is hydrophobic and effective in regard to low swellability, allows the formation of a resist pattern (cured film) having low swellability and being pliable, and can improve adhesiveness and developability, which are generally incompatible with each other, with excellent balance. Moreover, combining the binder polymer with the photopolymerizable compound is presumed to improve the resolution and flexibility.

Component (A): Binder Polymer

The photosensitive resin composition includes, as the component (A), a binder polymer including at least one kind of structural unit derived from a (meth)acrylic acid, a structural unit derived from styrene or α-methylstyrene, and at least one kind of structural unit derived from a hydroxyalkyl (meth)acrylate ester having a hydroxyalkyl group having from 1 to 12 carbon atoms (hereinafter, sometimes referred to as "specific binder polymer"). The component (A) may, if necessary, further include a binder polymer other than the specific binder polymer.

The structural unit derived from a (meth)acrylic acid is preferably a structural unit represented by the following formula (1), the structural unit derived from styrene or α-methylstyrene is preferably a structural unit represented by the following formula (2), and the structural unit derived from a hydroxyalkyl (meth)acrylate ester having a hydroxyalkyl group having from 1 to 12 carbon atoms is preferably a structural unit represented by the following formula (3).

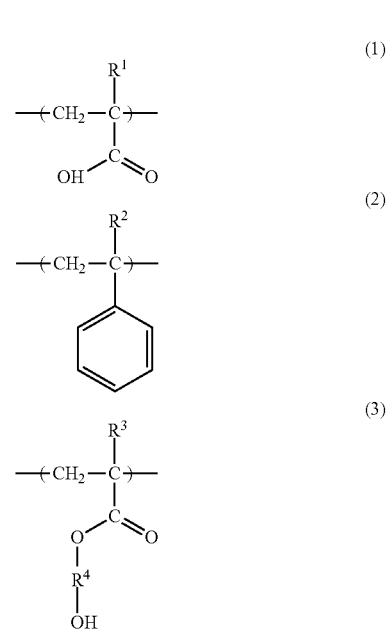

In the formulae (1) to (3), each of $R^1$, $R^2$ and $R^3$ independently represents a hydrogen atom or a methyl group, both $R^1$ and $R^3$ are preferably methyl groups, and $R^2$ is preferably a hydrogen atom. In the formula (3), $R^4$ is an alkylene group having from 1 to 12 carbon atoms and the OH group may be bonded to an arbitrary position of $R^4$.

In the specific binder polymer, the content ratio of the structural unit derived from styrene or α-methyl styrene based on the total mass of the polymerizable monomer for constituting the binder polymer is preferably from 10% by mass to 70% by mass, more preferably from 15% by mass to 60% by mass, and still more preferably from 20% by mass to 55% by mass, in terms of excellent adhesiveness and release property of the resulting resist pattern. In terms of excellent adhesiveness, the content ratio is preferably 10% by mass or more, more preferably 15% by mass or more, and still more preferably 20% by mass or more. In terms of excellent release property, the content ratio is preferably 70% by mass or less, more preferably 60% by mass or less, and still more preferably 55% by mass or less.

From the viewpoint of more enhanced resolution and release property, the content ratio of the structural unit derived from a hydroxyalkyl (meth)acrylate ester having a hydroxyalkyl group having from 1 to 12 carbon atoms in the specific binder polymer is preferably from 1% by mass to 50% by mass, more preferably from 2% by mass to 30% by mass, and still more preferably from 2% by mass to 20% by mass, based on the total mass of the polymerizable monomer for constituting the specific binder polymer. In terms of excellent resolution, the content ratio is preferably 50% by mass or less, more preferably 30% by mass or less, still more preferably 20% by mass or less, particularly preferably 15% by mass or less, and extremely preferably 10% by mass or less. In terms of excellent release property and adhesiveness, the content ratio is preferably 1% by mass or more, more preferably 2% by mass or more, and still more preferably 3% by mass or more.

The hydroxyalkyl group of the hydroxyalkyl (meth)acrylate ester is a hydroxyalkyl group having from 1 to 12 carbon atoms, preferably a hydroxyalkyl group having from 1 to 8 carbon atoms, more preferably a hydroxyalkyl group having from 1 to 6 carbon atoms, and still more preferably a hydroxyalkyl group having from 1 to 4 carbon atoms. Use of such a range can improve resolution, adhesiveness, and flexibility at excellent balance. In a case in which the number of carbon atoms is 4 or less, the resolution property can be more improved.

The specific binder polymer may have other structural units other than the above-described structural units. Examples of such other structural units include structural units derived from other polymerizable monomers described below.

Such other polymerizable monomers are not particularly limited as long as they are polymerizable monomers that are polymerizable with (meth)acrylic acid, styrene or α-methylstyrene, and a hydroxyalkyl (meth)acrylate ester, and are different from a (meth)acrylic acid, styrene or α-methylstyrene, and the hydroxyalkyl (meth)acrylate ester. Examples of such other polymerizable monomers include (meth) acrylic acid esters such as alkyl (meth)acrylates, cycloalkyl (meth)acrylates, benzyl (meth)acrylate, furfuryl (meth)acrylate, tetrahydrofurfuryl (meth)acrylate, isobornyl (meth) acrylate, adamantyl (meth)acrylate, dicyclopentanyl (meth) acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, dicyclopentenyloxyethyl (meth)acrylate, dicyclopentanyloxyethyl (meth)acrylate, isobonyloxyethyl (meth)acrylate, cyclohexyloxyethyl (meth)acrylate, adamantyloxyethyl (meth)acrylate, dicyclopentenyloxypropyloxyethyl (meth)acrylate, dicyclopentanyloxypropyloxyethyl (meth)acrylate, and adamantyloxypropyloxyethyl (meth)acrylate; (meth)acrylic acid derivatives such as α-bromoacrylic acid, α-chloroacrylic acid, β-furyl(meth) acrylic acid, and β-styryl(meth)acrylic acid; polymerizable styrene derivatives substituted on their aromatic rings, acrylamides such as diacetoneacrylamide; acrylonitrile; ether compounds of vinyl alcohol such as vinyl-n-butyl ether; maleic acid; maleic anhydride; maleic acid monoesters such as monomethyl maleate, monoethyl maleate, and monoisopropyl maleate; and unsaturated carboxylic acid derivatives such as fumaric acid, cinnamic acid, α-cyanocinnamic acid, itaconic acid, crotonic acid, and propiolic acid. These may be used singly, or in any combination of two or more kinds thereof.

The binder polymer preferably further includes a structural unit derived from an alkyl (meth)acrylate ester in terms of improving developability and release property.

The alkyl (meth)acrylate is preferably an alkyl (meth) acrylate that has an alkyl group having from 1 to 12 carbon atoms, and more preferably an alkyl (meth)acrylate that has an alkyl group having from 1 to 8 carbon atoms. Examples of the alkyl (meth)acrylate include methyl(meth)acrylate, ethyl(meth)acrylate, propyl(meth)acrylate, butyl(meth)acrylate, pentyl(meth)acrylate, hexyl(meth)acrylate, heptyl (meth)acrylate, octyl(meth)acrylate, 2-ethylhexyl(meth) acrylate, nonyl(meth)acrylate, decyl(meth)acrylate, undecyl (meth)acrylate, and dodecyl(meth)acrylate. These compounds may be used singly, or in any combination of two or more kinds thereof.

In case in which the binder polymer has the structural unit derived from alkyl (meth)acrylate ester, the content ratio thereof based on the total mass (100% by mass) of the polymerizable monomer for constituting the binder polymer is preferably from 1% by mass to 30% by mass, more preferably from 1% by mass to 20% by mass, and still more preferably from 2% by mass to 10% by mass, in terms of excellent release property, resolution, and adhesiveness. In terms of excellent release property, the content ratio is preferably 1% by mass or more, and more preferably 2% by mass or more. In terms of excellent resolution and adhesiveness, the content ratio is preferably 30% by mass or less, more preferably 20% by mass or less, and still more preferably from 10% by mass or less.

The specific binder polymer can be obtained, for example, by radical polymerization of (meth)acrylic acid, styrene or α-methyl styrene, and hydroxyalkyl (meth)acrylate ester, as polymerizable monomers (monomers), and optionally other polymerizable monomers, using an ordinary method.

As a component (A), a specific binder polymer may be used singly, or in any combination of two or more kinds thereof. The component (A) may further include a binder polymer other than the specific binder polymer.

The acid value of the binder polymer is preferably from 90 mg KOH/g to 250 mg KOH/g, more preferably from 100 mg KOH/g to 240 mg KOH/g, still more preferably from 120 mg KOH/g to 235 mg KOH/g, and even more preferably from 130 mg KOH/g to 230 mg KOH/g, in terms of excellent in developability and adhesiveness. In terms of reducing developing time, the acid value is preferably 90 mg KOH/g or more, more preferably 100 mg KOH/g or more, still more preferably 120 mg KOH/g or more, and even more preferably 130 mg KOH/g or more. In terms of achieving the sufficient adhesiveness of the cured product of the photosensitive resin composition, the acid value is preferably 250 mg KOH/g or less, more preferably 240 mg KOH/g or less, still more preferably 235 mg KOH/g or less, and even more preferably 230 mg KOH/g or less.

The weight-average molecular weight (Mw) of the binder polymer measured by gel permeation chromatography (GPC) (calculated based on a calibration curve produced using polystyrene standards) is preferably from 10,000 to 200,000, more preferably from 15,000 to 100,000, still more preferably from 20,000 to 80,000, and even more preferably from 23,000 to 60,000, in terms of excellent in developability and adhesiveness. In terms of excellent developability, the weight-average molecular weight is preferably 200,000 or less, more preferably 100,000 or less, still more preferably 80,000 or less, and even more preferably 60,000 or less. In terms of excellent adhesiveness, the weight-average molecular weight is preferably 10,000 or more, more preferably 15,000 or more, still more preferably 20,000 or more, even more preferably 23,000 or more, and particularly preferably 25,000 or more.

The dispersivity (weight-average molecular weight/number-average molecular weight) of the binder polymer is preferably 3.0 or less, more preferably 2.8 or less, and still more preferably 2.5 or less, in terms of excellent resolution and adhesiveness.

The binder polymer may have, in the molecule thereof, a characteristic group with sensitivity to light having a wavelength in a range of from 340 nm to 430 nm if necessary. Examples of the characteristic group include a group obtained by removing at least one hydrogen atom from the sensitizing dye described below.

The content of the component (A) in the photosensitive resin composition is preferably from 30 parts by mass to 70 parts by mass, more preferably from 35 parts by mass to 65 parts by mass, and still more preferably from 40 parts by mass to 60 parts by mass, with respect to 100 parts by mass of the total amount of the component (A) and the component (B), in terms of excellent film formability, sensitivity, and resolution. In terms of film (photosensitive resin composition layer) formability, the content is preferably 30 parts by mass or more, more preferably 35 parts by mass or more, and still more preferably 40 parts by mass or more. In terms of obtaining sufficient sensitivity and resolution, the content is preferably 70 parts by mass or less, more preferably 65 parts by mass or less, and still more preferably 60 parts by mass or less.

Component (B): Photopolymerizable Compound

The photopolymerizable compound (hereinafter, sometimes referred to as "component (B)") is explained. The photopolymerizable compound, which is the component (B), includes at least one bisphenolic di(meth)acrylate having from 1 to 20 structural units of an ethyleneoxy group and from 0 to 7 structural units of a propyleneoxy group (hereinafter, sometimes referred to as "specific polymerizable compound") as an essential component. The component (B) may, if necessary, further include a photopolymerizable compound other than the bisphenolic di(meth)acrylate.

In the specific polymerizable compound, the number of the structural units of an ethyleneoxy group is from 1 to 20. The "number of the structural units of an ethyleneoxy group" as used herein can be considered to be a measure that indicates how many ethyleneoxy groups have been added into the molecule. Therefore, it is an integer number for a single molecule, but it is a rational number, which is an average value, for a group of a plural kinds of molecule.

The number of the structural units of an ethyleneoxy group in the specific polymerizable compound is preferably 4 or more, more preferably 6 or more, and still more preferably 8 to more, in terms of more enhanced developability. It is preferably 16 or less, and more preferably 14 or less, in terms of more enhanced resolution property.

In the specific polymerizable compound, the number of the structural units of a propyleneoxy group is from 0 to 7. The "number of the structural units of a propyleneoxy group" as used herein can be considered to indicate the number of propyleneoxy groups having been added in the molecule. Therefore, it is an integer number for a single molecule, which is a rational number, which is an average value, for a group of a plural kinds of molecule. When the number of the structural units of a propyleneoxy group is 0, this means that the specific polymerizable compound has no propyleneoxy groups.

The number of the structural units of a propyleneoxy group in the specific polymerizable compound is preferably 2 or more, more preferably 3 or more, in terms of more enhanced resolution property of a resist. It is still more preferably 5 or less from the viewpoint of more enhanced developability.

The specific polymerizable compound is preferably a compound represented by the following Formula (4a).

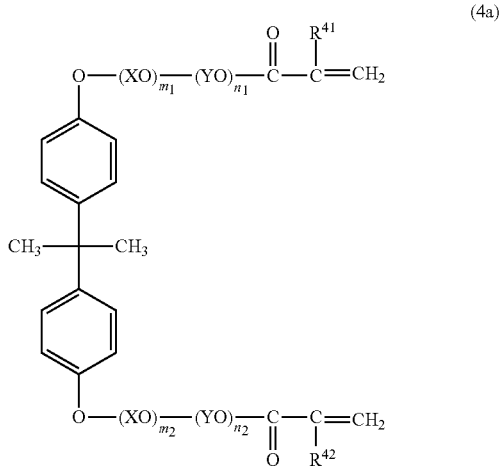

In Formula (4a), each of $R^{41}$ and $R^{42}$ independently represents a hydrogen atom or a methyl group. Each of XO and YO independently represents an ethyleneoxy group or a propyleneoxy group. In the molecule of the compound represented by Formula (4a), XO and YO may be present as continuous blocks or present randomly.

Each of $(XO)m_1$, $(XO)m_2$, $(YO)n_1$, and $(YO)n_2$ independently represents a (poly)ethyleneoxy group or a (poly)propyleneoxy group. Each of $m_1$, $m_2$, $n_1$, and $n_2$ independently may represent 0 to 20. When XO represents an ethyleneoxy group and YO represents a propyleneoxy group, $m_1+m_2$ is from 1 to 20, and $n_1+n_2$ is form 0 to 7. When XO represents a propyleneoxy group and YO represents an ethyleneoxy group, $m_1+m_2$ is from 0 to 7, and $n_1+n_2$ is form 1 to 20. Each of $m_1$, $m_2$, $n_1$, and $n_2$ represents the number of the structural unit. Therefore, the number of the structural unit indicates an integer value with respect to a single molecule, while it represents a rational number, which is an average value, with respect to a group of plural kinds of molecules. Hereinbelow, the same applies to the number of the structural unit.

Examples of commercially available products of the above-mentioned compound include 2,2-bis(4-(methacryloxydiethoxy)phenyl)propane (e.g., "FA-324M" manufactured by Hitachi Chemical Co., Ltd.), and 2,2-bis(4-(methacryloxy-polyethoxypolypropoxy)phenyl)propane (an adduct of 12 mol in average of ethyleneoxy groups and 4 mol in average of propyleneoxy groups) (e.g., "FA-3200MY" manufactured by Hitachi Chemical Co., Ltd.).

From the viewpoint of reducing the degree of swelling by suppressing molecular motion in the cross-linked network after photo-curing, the content of the specific polymerizable compound in the photosensitive resin composition is preferably from 1 part by mass to 60 parts by mass, more preferably from 5 part by mass to 55 parts by mass, and still more preferably from 10 part by mass to 50 parts by mass, with respect to 100 parts by mass of the total amount of the component (A) and the component (B).

From the viewpoint of reducing the degree of swelling by suppressing molecular motion in the cross-linked network after photo-curing, the content of the specific polymerizable compound in the photosensitive resin composition is preferably from 1 part by mass to 60 parts by mass, more preferably from 5 part by mass to 55 parts by mass, and still more preferably from 10 part by mass to 50 parts by mass, with respect to 100 parts by mass of the total amount of the component (A) and the component (B).

The photosensitive resin composition may include, as the component (B), an additional photopolymerizable compound other than the specific polymerizable compound. The additional photopolymerizable compound is not particularly limited as long as it is a compound capable of photopolymerizing. The additional photopolymerizable compound is preferably a compound having an ethylenically unsaturated bond. Examples of the compound having an ethylenically unsaturated bond include a compound having one ethylenically unsaturated bond in the molecule, a compound having two ethylenically unsaturated bonds in the molecule, a compound having three or more ethylenically unsaturated bonds in the molecule.

In a case in which the component (B) includes the additional photopolymerizable compound, the content of the additional photopolymerizable compound in the component (B) with respect to 100 parts by mass of the total mass of the component (B) is preferably from 1 parts by mass to 60 parts by mass, more preferably from 6 parts by mass to 50 parts by mass, and still more preferably from 10 parts by mass to 40 parts by mass, from the viewpoint of suppressing swelling physically via the bulky configuration of the cross-linked network.

It is preferable that the component (B) includes, as the additional photopolymerizable compound, at least one compound having two ethylenically unsaturated bonds in the molecule. In a case in which the component (B) includes, as the additional photopolymerizable compound, the compound having two ethylenically unsaturated bonds in the molecule, the content thereof is preferably from 5 parts by mass to 60 parts by mass, more preferably from 5 parts by mass to 55 parts by mass, and still more preferably 10 parts by mass to 50 parts by mass, with respect to 100 parts by mass of the total amount of the component (A) and the component (B).

Examples of the compound having two ethylenically unsaturated bonds in the molecule include a bisphenol di(meth)acrylate compound having a structure different from the structure of the specific polymerizable compound; a hydrogenated bisphenol A di(meth)acrylate compound; a di(meth)acrylate compound having a urethane bond in the molecule; a polyalkylene glycol di(meth)acrylate having both a (poly)ethyleneoxy group and a (poly)propyleneoxy group in the molecule, and trimethylolpropane di(meth)acrylate.

In a case in which the photosensitive resin composition further includes, as the component (B), the bisphenol di(meth)acrylate compound other than the specific polymerizable compound, the content thereof is preferably from 1 part by mass to 50 parts by mass, more preferably from 5 parts by mass to 50 parts by mass, and still more preferably from 10 parts by mass to 45 parts by mass, with respect to 100 parts by mass of the total amount of the component (A) and the component (B).

Examples of the hydrogenated bisphenol A di(meth)acrylate compound include 2,2-bis(4-(methacryloxypentaethoxy)cyclohexyl)propane. In a case in which the photosensitive resin composition further includes, as the component (B), the hydrogenated bisphenol A di(meth)acrylate compound, the content thereof is preferably from 1 part by mass to 50 parts by mass, and more preferably from 5 parts by mass to 40 parts by mass, with respect to 100 parts by mass of the total amount of the component (A) and the component (B).

It is preferable that the component (B) includes, as the additional photopolymerizable compound, at least one polyalkylene glycol di(meth)acrylate, from the viewpoint of improving flexibility of the resist pattern. In a case in which the photosensitive resin composition includes the polyalkylene glycol di(meth)acrylate, the content thereof is preferably from 5 parts by mass to 30 parts by mass, and more preferably from 10 parts by mass to 25 parts by mass, with respect to 100 parts by mass of the total amount of the component (A) and the component (B).

The polyalkylene glycol di(meth)acrylate is preferably a polyalkylene glycol di(meth)acrylate having both of a (poly)ethyleneoxy group and a (poly)propyleneoxy group in the molecule. In the molecule of the polyalkylene glycol di(meth)acrylate, the (poly)ethyleneoxy group and the (poly)propyleneoxy group may be present as continuous blocks or present randomly. Here, the propyleneoxy group of the (poly)propyleneoxy group may be either a n-propyleneoxy group or an isopropyleneoxy group. In the (poly)isopropyleneoxy group, the oxygen atom may bind to the secondary carbon atom of the propylene group, or the primary carbon atom thereof.

The polyalkylene glycol di(meth)acrylate may include (poly)n-butyleneoxy group, (poly)isobutyleneoxy group, (poly)n-pentyleneoxy group, or (poly)hexyleneoxy group, or the constitutional isomer thereof, such as (poly)alkyleneoxy group having from about 4 to about 6 carbon atoms.

The component (B) may include, as the additional photopolymerizable compound, at least one photopolymerizable compound having three or more ethylenically unsaturated bonds in the molecule thereof.

Examples of the compound having three or more ethylenically unsaturated bonds in the molecule thereof include trimethylolpropane tri(meth)acrylate, an EO-modified trimethylolpropane tri(meth)acrylate (in which the number of structural units of the ethyleneoxy group is from 1 to 5), a PO-modified trimethylolpropane tri(meth)acrylate, an EO, PO-modified trimethylolpropane tri(meth)acrylate, tetramethylolmethane tri(meth)acrylate, tetramethylolmethane tetra(meth)acrylate, pentaerythritol tri(meth)acrylate, and dipentaerythritol hexa(meth)acrylate. These compounds may be used singly, or in combination of two or more kinds thereof.

Examples of commercially available product of the compound having three or more ethylenically unsaturated bonds include tetramethylolmethane triacrylate (e.g., "A-TMM-3" manufactured by Shin-Nakamura Chemical Co., Ltd.), EO-modified trimethylolpropane trimethacrylate (e.g., "TMPT21E", "TMPT30E" manufactured by Hitachi Chemical Co., Ltd), pentaerythritol triacrylate (e.g., "SR444" manufactured by Sartomer), dipentaerythritol hexaacrylate (e.g., "A-DPH" manufactured by Shin-Nakamura Chemical Co., Ltd.), and ethoxylated pentaerythritol tetraacrylate (e.g., "ATM-35E" manufactured by Shin-Nakamura Chemical Co., Ltd).

In a case in which the component (B) includes, as the additional photopolymerizable compound, the compound having three or more ethylenically unsaturated bonds, the content thereof is preferably from 3 parts by mass to 30 parts by mass, more preferably from 5 parts by mass to 25 parts by mass, and still more preferably from 5 parts by mass to 20 parts by mass, with respect to 100 parts by mass of the total amount of the component (A) and the component (B), from the viewpoint of improving the balance between resolution, adhesiveness, resist shape, and release property after curing.

The component (B) may include, as the additional photopolymerizable compound, a compound having one ethylenically unsaturated bond in the molecule, in terms of improving the balance between the resolution, adhesiveness, resist shape, and release property after curing of the resulting resist pattern, or suppressing the occurrence of scum.

Examples of the compound having one ethylenically unsaturated bond in the molecule include nonylphenoxy polyethyleneoxy acrylate, a phthalic acid compound, and an alkyl (meth)acrylate. Among these, from the viewpoint of improving the balance between the resolution, adhesiveness, resist shape, and release property after curing of the resulting resist pattern, it is preferable to include nonylphenoxy polyethyleneoxy acrylate or a phthalic acid compound.

In a case in which the component (B) includes, as the additional photopolymerizable compound, the photopolymerizable compound having one ethylenically unsaturated bond in the molecule, the content thereof is preferably from 1 part by mass to 20 parts by mass, more preferably from 3 parts by mass to 15 parts by mass, and still more preferably from 5 parts by mass to 12 parts by mass, with respect to 100 parts by mass of the total amount of the component (A) and the component (B).

The total content of the component (B) in the photosensitive resin composition is preferably from 30 parts by mass to 70 parts by mass, more preferably from 35 parts by mass to 65 parts by mass, and still more preferably from 35 parts by mass to 50 parts by mass, with respect to 100 parts by mass of the total amount of the component (A) and the component (B). In a case in which the content is 30 parts by mass or more, sufficient sensitivity of the photosensitive resin composition and sufficient resolution of the resulting resist pattern can be easily obtained. In a case in which the content is 70 parts by mass or less, the film (photosensitive resin composition layer) can be easily formed and the excellent resist shape can be easily obtained.

Component (C): Photopolymerization Initiator

The photosensitive resin composition includes, as component (C), at least one photopolymerization initiator. The photopolymerization initiator as the component (C) is not particularly limited, and appropriately selected from conventionally employed photopolymerization initiators. Examples of the photopolymerization initiator include aromatic ketones such as benzophenone, 2-benzyl-2-dimethylamino-1-(4-morpholinophenyl)-butanone-1, or 2-methyl-1-[4-(methylthio)phenyl]-2-morpholino-propanone-1; quinones such as an alkylanthraquinone; benzoin ether compounds such as a benzoin alkyl ether; benzoin compounds such as benzoin and an alkyl benzoin; benzyl derivatives such as benzyl dimethyl ketal; 2,4,5-triarylimidazole dimers such as 2-(2-chlorophenyl)-4,5-diphenylimidazole dimer, or 2-(2-fluorophenyl)-4,5-diphenylimidazole dimer; and acridine derivatives such as 9-phenylacridine or 1,7-(9,9'-acridinyl)heptane. These compounds may be used singly, or in combination of two or more kinds thereof.

In terms of improving the sensitivity of the photosensitive resin composition and the adhesiveness of the resulting resist pattern, the component (C) preferably includes at least one 2,4,5-triarylimidazole dimer, and more preferably includes 2-(2-chlorophenyl)-4,5-diphenylimidazole dimer. The structure of the 2,4,5-triarylimidazole dimer may be symmetric or asymmetric.

The content of the component (C) in the photosensitive resin composition is preferably from 0.1 parts by mass to 10 parts by mass, more preferably from 1 part by mass to 7 parts by mass, still more preferably from 2 parts by mass to 6 parts by mass, and even more preferably from 3 parts by mass to 5 parts by mass, with respect to 100 parts by mass of the total amount of the component (A) and the component (B). In a case in which the content of the component (C) is 0.1 parts by mass or more, excellent sensitivity, resolution, or adhesiveness can be easily obtained. In a case in which the content is 10 parts by mass or less, excellent resist shape can be easily obtained.

The photosensitive resin composition of the present invention preferably includes (D) a sensitizing dye and/or (E) a hydrogen donor in addition to the above-described components (A) to (C).

Component (D): Sensitizing Dye

The photosensitive resin composition preferably includes at least one kind of sensitizing dye as the component (D). The sensitizing dye is a material that allows effective utilization of the absorption wavelength of active light rays to be used for exposure, and a compound with a local maximum absorption wavelength of from 340 nm to 420 nm is preferable.

Examples of the sensitizing dye include pyrazoline compounds, anthracene compounds, coumarin compounds, xanthone compounds, oxazole compounds, benzooxazole compounds, thiazole compounds, benzothiazole compounds, triazole compounds, stilbene compounds, triazine compounds, thiophene compounds, and naphthalimide compounds. Especially from the viewpoint of successfully improving resolution, adhesiveness, and sensitivity, the sensitizing dye preferably includes a pyrazoline compound or an anthracene compound. The sensitizing dye as component (D) may be used singly or in combination of two or more kinds thereof.

In a case in which the photosensitive resin composition may include the component (D), the content of the component (D) in the photosensitive resin composition is preferably from 0.01 parts to about 10 parts by mass, more preferably from 0.05 parts to about 5 parts by mass, and still more preferably from 0.1 parts to about 3 parts by mass, with respect to 100 parts by mass of the total amount of the component (A) and the component (B). In a case in which the content is 0.01 parts by mass or more, sufficient sensitivity and resolution can be easily obtained. In a case in which the content is 10 parts by mass or less, sufficiently excellent resist shape can be easily obtained.

Component (E): Hydrogen Donor

In order to improve the contrast between an exposed area and an unexposed area (sometimes referred to as "imaging property"), the photosensitive resin composition preferably includes at least one hydrogen donor capable of donating hydrogen to the photopolymerization initiator as the component (E) during the reaction of the exposed area. Examples of the hydrogen donor include bis[4-(dimethylamino)phenyl]methane, bis[4-(diethylamino)phenyl]methane, and leucocrystal violet. These may be used singly, or in combination of two or more kinds thereof.

In a case in which the photosensitive resin composition includes the component (E), the content thereof is preferably from 0.01 parts by mass to 10 parts by mass, more preferably from 0.05 to 5 parts by mass, and still more preferably from 0.1 parts by mass to 2 parts by mass, with respect to 100 parts by mass of the total amount of the component (A) and the component (B). In a case in which the content is 0.01 parts by mass or more, it will tend to become easier to obtain sufficient sensitivity. If the content is 10 parts by mass or less, excess component (E) tends to be inhibited from depositing as foreign matter after the formation of a film.

Other Components

The photosensitive resin composition may include, if necessary, the other components, for example, a photopolymerizable compound (such as an oxetane compound) having at least one cation polymerizable cyclic ether group in the molecule thereof; a cation polymerization initiator; a dye such as Malachite Green, Victoria Pure Blue, Brilliant Green, or Methyl Violet; a photochromic agent such as tribromophenylsulfone, diphenylamine, benzylamine, triphenylamine, diethylaniline, or 2-chloroaniline; a thermal development inhibitor; a plasticizer such as 4-toluenesulfonamide; a pigment; a filler; an antifoaming agent; a flame retardant; a stabilizing agent; a tackifier; a leveling agent; a release promoter; an antioxidant; perfume; an imaging agent; a thermal crosslinking agent; or the like. These compounds may be used singly, or in combination of two or more kinds thereof. In a case in which the photosensitive resin composition may include the other components, the content thereof is preferably from about 0.01 parts to about 20 parts by mass, with respect to 100 parts by mass of the total amount of the component (A) and the component (B).

Solution of Photosensitive Resin Composition

The photosensitive resin composition according to the present embodiment may further include, if necessary, at least one organic solvent in order to adjust viscosity of the photosensitive resin composition. Examples of the organic solvent include alcohol solvents such as methanol or ethanol; ketone solvents such as acetone, or methyl ethyl ketone; glycol ethers such as methylcellosolve, ethylcellosolve, or propyleneglycol monomethyl ether; aromatic hydrocarbon solvents such as toluene; and aprotic polar solvents such as N,N-dimethylformamide. These solvents may be used singly, or in combination of two or more kinds thereof. The content of the organic solvent in the photosensitive resin composition can be appropriately selected depending on the purpose or the like. For example, the organic solvent may be used to give a solution with a solid content of from about 30% by mass to about 60% by mass. Hereinbelow, the photosensitive resin composition containing the organic solvent is sometimes referred to as "coating solution".

The photosensitive resin composition layer, which is a coating film of the photosensitive resin composition, can be formed by applying the coating solution onto a surface of a support film described below or a metal plate and drying the resultant. The metal plate is not particularly limited and can be appropriately selected depending on the purpose or the like. Examples of the metal plate include plates of metal such as copper, a copper-based alloy, nickel, chromium, iron, and an iron-based alloy such as stainless steel. Preferable examples of the metal plate include copper, a copper-based alloy, and an iron-based alloy.

The thickness of the resulting photosensitive resin composition layer is not particularly limited and can be appropriately selected depending on the intended use or the like. For example, the thickness of the photosensitive resin composition layer is preferably from about 1 µm to about 100 µm after drying. In a case in which the photosensitive resin composition layer is formed on the metal plate, the surface opposite the metal plate in the photosensitive resin composition layer may be covered with a protective film. Examples of the protective film include polymer films such as polyethylene or polypropylene.

The photosensitive resin composition can be applied to the formation of a photosensitive resin composition layer of a photosensitive element described below. That is, another embodiment of the present invention is the application to a photosensitive element of a photosensitive resin composition including: component (A): a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms; component (B): a photopolymerizable compound including a bisphenolic di(meth)acrylate having from 1 to 20 structural units of an ethyleneoxy group and having from 0 to 7 structural units of a propyleneoxy group; and component (C): a photopolymerization initiator.

The photosensitive resin composition of the present embodiment can be used for the method for forming a resist pattern described below. That is, in another embodiment of the present invention is the application to a method for forming a resist pattern of a photosensitive resin composition including: component (A): a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms; component (B): a photopolymerizable compound including a bisphenolic di(meth)acrylate having from 1 to 20 structural units of an ethyleneoxy group and having from 0 to 7 structural units of a propyleneoxy group; and component (C): a photopolymerization initiator.

Photosensitive Element

The photosensitive element of the present invention has: a support; and a photosensitive resin composition layer that is provided on the support and that is formed from the above-described photosensitive resin composition. The photosensitive resin composition layer may be a coating layer. The coating layer as used herein is a layer in which a photosensitive resin composition is in an uncured state. The photosensitive element may, if necessary, have another layer such as a protective layer.

FIG. 1 shows an embodiment of a photosensitive element. In a photosensitive element 1 shown in FIG. 1, a support 2, a photosensitive resin composition layer 3, which is a coating film of the photosensitive resin composition, and a protective layer 4 are layered in this order. The photosensitive element 1 can be obtained, for example, as follows. That is, a coating solution, which is the photosensitive resin composition containing an organic solvent, is applied onto the support 2 to form a coating layer, and the resultant is dried to form the photosensitive resin composition layer 3. The surface opposite the support 2 in the photosensitive resin composition layer 3 is then covered with the protective layer 4, thereby obtaining the photosensitive element 1 according to the present embodiment provided with the support 2, the photosensitive resin composition layer 3 formed on the support 2, and the protective layer 4 layered on the photosensitive resin composition layer 3. The photosensitive element 1 is not necessarily provided with the protective layer 4.

As the support film, a polymer film having heat resistance and solvent resistance, such as polyester (e.g., polyethylene terephthalate), polypropylene, or polyethylene may be used.

The thickness of the support film (polymer film) is preferably from 1 µm to 100 µm, more preferably from 5 µm to 50 µm, and still more preferably from 5 µm to 30 µm. In a case in which the thickness of the support film is 1 µm or more, tearing of the support film during releasing the support film can be suppressed. In a case in which the thickness is 100 µm or less, deterioration in resolution can be suppressed.

The protective film is preferably one whose adhesive force with respect to the photosensitive resin composition layer is lower than the adhesive force of the support film with respect to the photosensitive resin composition layer. The protective film is preferably a low-fisheye film. The term "fisheye" as used herein mean inclusion of a foreign material, an undissolved material, an oxidatively degraded material, or the like of a raw material that has been taken into the film during manufacture of the film by thermal melting, kneading, extrusion, biaxially-stretching, or casting the raw material. That is, "low-fisheye" means that the film contains few foreign materials.

More specifically, the protective film used here may be a film of a polymer having heat resistance and solvent resistance, such as polyester including polyethylene terephthalate, polypropylene, or polyethylene. Examples of commercially available products thereof include ALPHAN MA-410 and E-200 manufactured by Oji Paper Co., Ltd.; a polypropylene film manufactured by Shin-Etsu Film Co., Ltd.; and a polyethylene terephthalate film of PS series such as PS-25 manufactured by Teijin Limited. The protective layer 4 may be the same material as the support 2.

The thickness of the protective film is preferably from 1 µm to 100 µm, more preferably from 5 µm to 50 µm, still more preferably from 5 µm to 30 µm, and even more preferably from 15 µm to 30 µm. In a case in which the thickness of the protective film is 1 µm or more, tearing of the protective film during laminating the photosensitive resin composition layer and the support film on the substrate while releasing the protective film can be suppressed. In a case in which the thickness is 100 μm or less, excellent handleability and low cost can be achieved.

More specifically, the photosensitive element according to the present embodiment can be manufactured, for example, as follows. That is, the photosensitive element can be manufactured by the manufacture method that includes a process of preparing a coating solution in which the component (A): the binder polymer, the component (B): the photopolymerizable compound, and the photopolymerization initiator (C) are dissolved in the organic solvent; a process of forming a coating layer by applying the coating solution to a support (a support film); and a process of drying the resultant to form the photosensitive resin composition layer.

The coating of the solution of the photosensitive resin composition to the support film may be carried out by a known method such as roll coating, comma coating, gravure coating, air knife coating, die coating, or bar coating.

The drying condition of the coating layer is not particularly limited as long as at least a part of the organic solvent can be removed from the coating layer. The drying is preferably carried out at from 70° C. to 150° C. for about 5 minutes to about 30 minutes. The amount of the residual organic solvent in the photosensitive resin composition layer after drying is preferably 2% by mass or less from the viewpoint of preventing diffusion of the organic solvent in subsequent processes.

The thickness of the photosensitive resin composition layer in the photosensitive element can be appropriately selected depending on the intended use. The post-drying thickness is preferably from 1 μm to 100 μm, more preferably from 1 μm to 50 μm, and still more preferably from 5 μm to 40 μm. In a case in which the thickness of the photosensitive resin composition layer is 1 μm or more, industrial coating can be easily carried out. In a case in which the thickness is 100 μm or less, sufficient adhesiveness and resolution can be easily obtained.

The transmittance of ultraviolet rays through the photosensitive resin composition layer is preferably from 5% to 75%, more preferably from 10% to 65%, and still more preferably from 15% to 55%, with respect to ultraviolet rays with a wavelength of from 350 nm to 420 nm. In a case in which the transmittance is 5% or more, sufficient adhesiveness can be easily obtained. In a case in which the transmittance is 75% or less, sufficient resolution can be easily obtained. The transmittance can be measured by a UV spectrometer. The UV spectrometer used here may be a type 228A double beam spectrometer (manufactured by Hitachi, Ltd).

The photosensitive element may further include an intermediate layer such as a cushion layer, an adhesion layer, a light absorbing layer, or a gas barrier layer. For example, the intermediate layer described in JP-A No. 2006-098982 may be applied to the intermediate layer in the present invention.

The shape of the resulting photosensitive element is not particularly limited. The photosensitive element may be a sheet form, or may be rewound into a roll shape around a core. In a case in which the photosensitive element is rewound into a roll shape, it is preferable to rewind the element such that the support film faces outside. Examples of the material for the core include plastics such as a polyethylene resin, a polypropylene resin, a polystyrene resin, a polyvinyl chloride resin, or an ABS resin (acrylonitrile-butadiene-styrene copolymer). On the edge of the photosensitive element roll thus obtained, it is preferable to provide an edge separator from the viewpoint of edge protection, and it is preferable to provide a moisture-proof edge separator from the viewpoint of edge fusion resistance. As the packing method, a black sheet with low moisture permeability is preferably used to pack.

The photosensitive element according to the present embodiment can be used, for example, in the method for forming a resist pattern described below.

Method for Forming Resist Pattern

The photosensitive resin composition can be used to form a resist pattern. The present method for forming a resist pattern, the method includes: (i) forming, a photosensitive resin composition layer on a substrate using the abovementioned photosensitive resin composition; (ii) irradiating at least a part of an area of the photosensitive resin composition layer with active light rays and photo-curing the area to form a cured material area; and (iii) removing an area other than the cured material area of the photosensitive resin composition layer from the substrate to form a resist pattern, which is the cured material area, on the substrate. The method for forming the resist pattern may further include other processes if necessary. The photosensitive resin composition layer in the forming may be a coating layer.

(i) Photosensitive Layer Forming Process

First, the photosensitive resin composition layer, which is a coating film of the photosensitive resin composition, is formed on a substrate. The substrate used here may be a substrate (a substrate for forming circuits) provided with an insulating layer and a conductor layer formed on the insulating layer.

In a case in which the photosensitive element has the protective film 4, the photosensitive resin composition layer is formed on the substrate by removing the protective film and then pressure bonding the photosensitive resin composition layer of the photosensitive element to the substrate while heating. As a result, a resulting layered body in which the substrate, the photosensitive resin composition layer, and the support film are layered in this order can be obtained.

The photosensitive layer forming process is preferably carried out under reduced pressure from the viewpoint of adhesiveness and follow-up property. The temperature of applying heat to at least one of the photosensitive resin composition layer and the substrate during contact bonding is preferably from 70° C. to 130° C., and the contact bonding pressure thereof is preferably from about 0.1 MPa to about 1.0 MPa (about 1 kgf/cm$^2$ to about 10 kgf/cm$^2$). These conditions are not particularly limited, and are appropriately selected as needed. In a case in which the photosensitive resin composition layer is heated at from 70° C. to 130° C., it is not necessary to subject the substrate to preheating in advance. However, preheating of the substrate for forming circuits can further improve adhesiveness and follow-up property.

(ii) Exposure Process

In the exposure process, at least a part of an area of the photosensitive resin layer thus formed on the substrate is irradiated with active light rays to cure the area irradiated with active light rays, thereby forming a latent image. In a case in which the support film on the photosensitive resin composition layer transmits active light rays, it is possible to irradiate active light lays through the support film. On the other hand, in a case in which the support film blocks active light lays, the support film is removed and then the photosensitive resin composition layer is irradiated with active light rays.

Examples of the method of exposure include a method of irradiating active light rays imagewise through a negative or positive pattern, which is referred to as artwork (mask exposure method). Alternatively, a method for irradiating active light rays imagewise by a direct writing exposure method such as LDI (Laser Direct Imaging) exposure method or DLP (Digital Light Processing) exposure method may be used.

The light source of the active light rays is not particularly limited, and may be a known light source. Examples of the light source include gas lasers such as a carbon arc lamp, a mercury vapor arc lamp, an ultra-high-pressure mercury lamp, a xenon lamp, or an argon laser; solid lasers such as a YAG laser; semiconductor lasers; ultraviolet rays such as a gallium nitride-based violet laser; and a lamp that efficiently emits visible light.

The wavelength of the active light rays (exposure wavelength) is preferably in a range of from 340 nm to 430 nm, and more preferably 350 nm to 420 nm, from the viewpoint of achieving the effect of the present invention more reliably.

(iii) Developing Process

In the developing process, an uncured area of the photosensitive resin composition layer is removed from the substrate for forming circuits through a development process, thereby forming a resist pattern, which is a cured material obtained by photo-curing the photosensitive resin composition layer, on the substrate. In a case in which the support film remains on the photosensitive resin composition layer, the support film is removed and then the unexposed area is removed (developed). Examples of the development process include wet development and dry development, and the wet development is widely used.

In the case of wet development, a developing solution suitable for the photosensitive resin composition is used and development is achieved by a known development method. Examples of the development method include a dip method, a paddle method, a spray method, brushing, slapping, scrapping, and dipping while shaking. From the viewpoint of improving resolution, a high-pressure spray method is suitable. The development may be carried out by combining two or more of these methods.

The developing solution is appropriately selected depending on the components of the photosensitive resin composition. Examples of the developing solution include an aqueous alkali solution, an aqueous developing solution, and an organic solvent developing solution.

The aqueous alkali solution used as the developing solution is safe and stable and has excellent handlability. Examples of bases to be used for the aqueous alkali solution include alkali hydroxides such as a lithium, sodium or potassium hydroxide; alkali carbonates such as a lithium, sodium, potassium or ammonium carbonate or bicarbonate; alkali metal phosphates such as potassium phosphate or sodium phosphate; and alkali metal pyrophosphate such as sodium pyrophosphate or potassium pyrophosphate.

The aqueous alkali solution used as the developing solution is preferably a 0.1% by mass to 5% by mass sodium carbonate dilute solution, a 0.1% by mass to 5% by mass potassium carbonate dilute solution, a 0.1% by mass to 5% by mass sodium hydroxide dilute solution, or a 0.1% by mass to 5% by mass sodium tetraborate dilute solution. The pH of the aqueous alkali solution is preferably in a range of from 9 to 11. The temperature is adjusted in accordance with the alkali developing property of the photosensitive resin composition layer. The aqueous alkali solution may contain a surfactant, an antifoaming agent, a small amount of an organic solvent to accelerate development, or the like.

Examples of the organic solvent used for the aqueous developing solution include acetone, ethyl acetate, an alkoxyethanols having alkoxy group of from 1 to 4 carbon atoms, ethyl alcohol, isopropyl alcohol, butyl alcohol, diethylene glycol monomethyl ether, diethylene glycol monoethyl ether, and diethylene glycol monobutyl ether. These solvents may be used singly, or in combination of two or more kinds thereof. In general, the content ratio of the organic solvent in the aqueous developing solution is preferably from 2% by mass to 90% by mass. The temperature of the organic solvent may be adjusted depending on the alkali developing property. The aqueous developing solution may contain a small amount of surfactant, antifoaming agent, or the like.

Examples of the organic solvent used for the organic solvent developing solution include 1,1,1-trichloroethane, N-methylpyrrolidone, N,N-dimethylformamide, cyclohexanone, methyl isobutyl ketone, and γ-butyrolactone. For anti-inflammability, it is preferable to add water to at least one of these organic solvents in a range of from 1% by mass to 20% by mass to prepare the organic solvent developing solution.

As needed, the method for forming a resist pattern may further include a process of heating at about 60° C. to 250° C. or exposing at about 0.2 J/cm$^2$ to 10 J/cm$^2$ after the removal of the unexposed area to further cure the resist pattern.

Method for Producing Printed Wiring Board

The method for producing a printed wiring board, the method may include a process of etching or plating a substrate (substrate for forming circuits), which has an insulating layer and a conductor layer formed on the insulating layer and in which the resist pattern has been formed on the conductor layer, by the method for forming a resist pattern to form a conductor pattern. As needed, the method for producing a printed wiring board may include another process such as a resist removing process. The conductor layer or the like of the substrate is treated by etching or plating using the developed resist pattern as a mask.

In the etching treatment, using a resist pattern (cured resist) formed on the substrate as a mask, an areas of the conductor layer of the substrate for forming circuits, the area being not covered with the cured resist, is removed by etching to form the conductor pattern. The method for etching is appropriately selected depending on components of the conductor layer to be removed. Examples of etching solutions include a cupric chloride solution, a ferric chloride solution, an alkali etching solution, and a hydrogen peroxide etching solution. Among these, it is preferable to use the ferric chloride solution in view of sufficient etch factor.

In the plating treatment, using a resist pattern (cured resist) formed on the substrate as a mask, cupper, a solder, and the like are plated on areas of the conductor layer of the substrate for forming circuits, the areas which is not covered with the cured resist. After plating, the cured resist is removed, and then the conductor layer that has been covered with the cured resist is subjected to etching, thereby forming the conductor pattern. The plating may be electrolytic plating, or non-electrolytic plating. Examples of the plating include copper plating such as copper sulfate plating or copper pyrophosphate plating; solder plating such as high throwing solder plating; nickel plating such as Walt bath (nickel sulfate-nickel chloride) plating or nickel sulfaminate plating; and gold plating such as hard gold plating or soft gold plating.

The resist pattern on the substrate is removed (released) after the etching and plating. For example, the removal of the resist pattern may be achieved with an aqueous solution of stronger alkalinity than the aqueous alkali solution used in the developing process. The strong alkaline aqueous solution used here may be a 1% by mass to 10% by mass sodium hydroxide aqueous solution or a 1% by mass to 10% by mass potassium hydroxide aqueous solution. Among these, it is preferable to use a 1% by mass to 10% by mass sodium or potassium hydroxide aqueous solution, and more preferable to use a 1% by mass to 5% by mass sodium hydroxide aqueous solution or a 1% by mass to 5% by mass potassium hydroxide aqueous solution. Examples of the releasing method include a dipping method and a spraying method, and these methods are used singly or in combination of two or more kinds thereof.

In a case in which the resist pattern is removed after plating, the conductor layer that has been covered with the cured resist can be further removed by etching to form the conductor pattern, whereby the intended printed wiring board can be manufactured. The etching method is appropriately selected depending on components of the conductor layer to be removed. For example, the above-described etching solution can be used.

The method for producing the printed wiring board according to the present invention may be applied to manufacture of not only single-layer printed wiring boards but also multilayer printed wiring boards, and may be applied to manufacture of printed boards with miniature through-holes.

The photosensitive resin composition according to the present embodiment can be used suitably for the production of a wiring board. That is, one of the preferable embodiments of the present invention is the application to the production of a printed wiring board of a photosensitive resin composition including: component (A): a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms; component (B): a photopolymerizable compound including a bisphenolic di(meth)acrylate having from 1 to 20 structural units of an ethyleneoxy group and having from 0 to 7 structural units of a propyleneoxy group; and component (C): a photopolymerization initiator.

A more preferable embodiment is the application of the above-mentioned photosensitive resin composition to the production of a high density package substrate and the application of the photosensitive resin composition to a semi-additive process. One example of a process of the production of a wiring board by a semi-additive process is explained below with reference to drawings.

Figure 2:
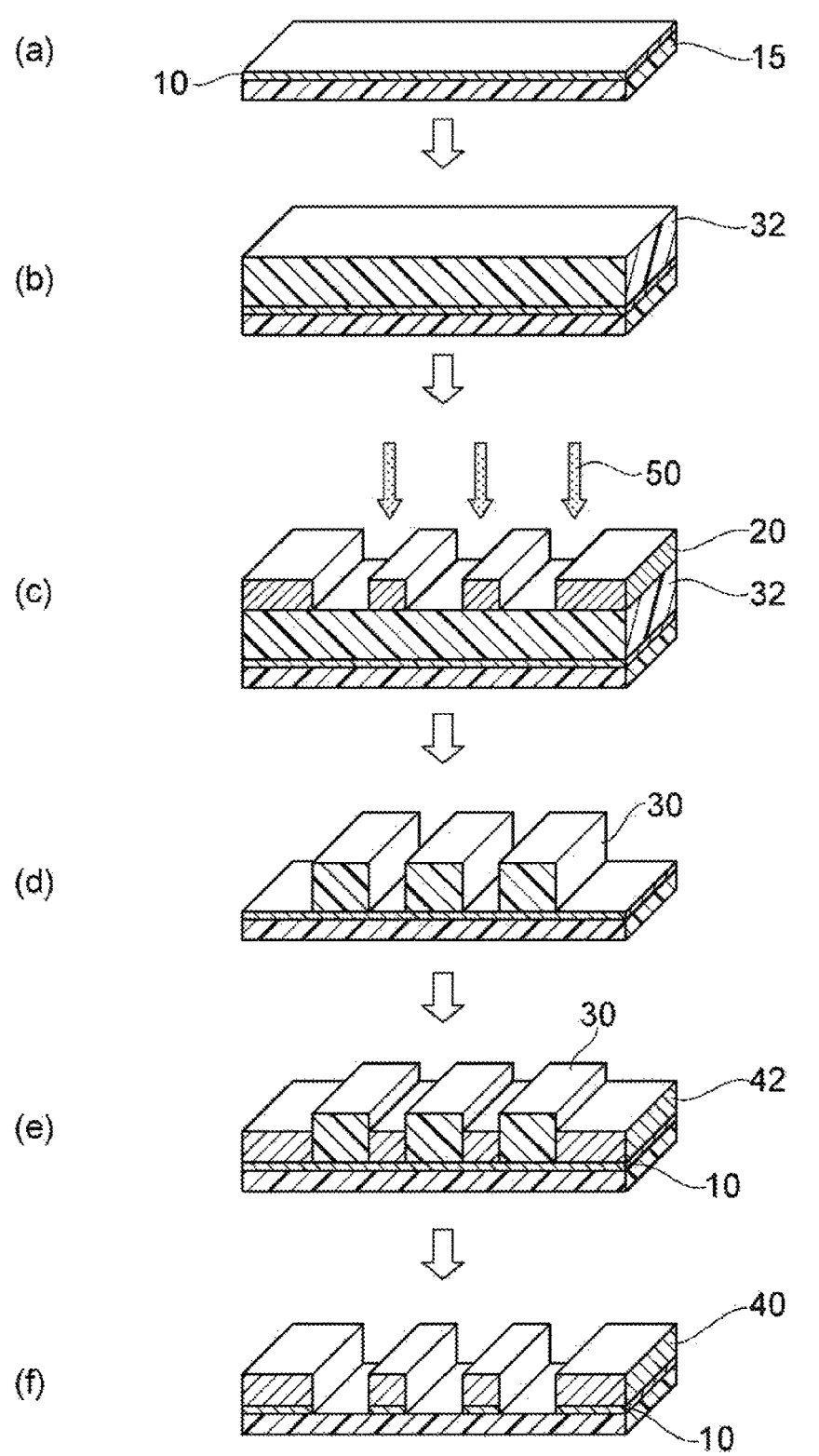
FIG. 2 is schematic perspective views illustrating an example of a producing method of a printed wiring board using a semi-additive process.

FIG. 2(a) shows the preparation of a substrate (substrate for forming circuits) in which a conductor layer 10 is formed on an insulating layer 15. The conductor layer 10 is, for example, a metal copper layer. FIG. 2(b) shows the formation of a photosensitive resin composition layer 32 on the conductor layer 10 of the substrate by the photosensitive layer forming process. FIG. 2(c) shows the formation of a photo-cured area by arranging a mask 20 on the photosensitive resin composition layer 32 and exposing an area other than the area on which the mask 20 is arranged by irradiation of an active light ray 50. FIG. 2(d) shows the formation of a resist pattern 30 as the photo-cured area on the substrate by removal of the area other than the photo-cured area formed by the exposure process from the substrate. FIG. 2(e) shows the formation of a plated layer 42 on the conductor layer 10 by plate processing using as a mask the resist pattern 30 of the photo-cured area. FIG. 2(f) shows the formation of a circuit pattern 40 by releasing the resist pattern 30 of the photo-cured area with a strong alkaline aqueous solution followed by etching to remove a part of the plated layer 42 and the conductor layer 10 that has been masked with the resist pattern 30. The material of the conductor layer 10 and a material of the plated layer 42 may be same or different. In FIG. 2, the method for forming the resist pattern 30 using the mask 20 is illustrated. However, the resist pattern 30 may be formed by a direct writing exposure method without the use of the mask 20.

EXAMPLES

The present invention is described below more specifically with reference to Examples, but the present invention is not limited to these examples.

Example 1

Preparation of Solution of Photosensitive Resin Composition

Each of solutions of photosensitive resin compositions of Examples 1 to 3 and Comparative Examples 1 to 3 was prepared by mixing components (A) to (E) and a dye shown in Tables 2 and 3 in compounding amounts (unit: g) shown in the tables with 9 g of acetone, 5 g of toluene, and 5 g of methanol. The compounding amount of the component (A) shown in Tables 2 and 3 is mass of non-volatile content (amount of solid content). The details of respective components shown in Tables 2 and 3 are as follows. Here, "-" in Tables 2 and 3 means that the component is not contained.

(A) Binder Polymer

Synthesis of Binder Polymer (A-1)

81 g of methacrylic acid, 15 g of 2-hydroxyethyl methacrylate, 135 g of styrene, and 69 g of benzyl methacrylate (mass ratio: 27/5/45/23) as polymerizable monomers (monomers) were mixed with 1.5 g of azobisisobutyronitrile, thereby obtaining a solution as "solution a".

0.5 g of azobisisobutyronitrile was dissolved in 100 g of a mixture of 60 g methylcellosolve and 40 g toluene (mass ratio of 3:2), thereby obtaining a solution as "solution b".

In a flask equipped with a stirrer, a reflux condenser, a thermometer, a dropping funnel, and a nitrogen gas inlet tube, 300 g of a mixture of 180 g methylcellosolve and 120 g toluene (mass ratio of 3:2) was added, and the resultant was stirred while blowing nitrogen gas into the flask and heated to 80° C.

The solution a was added dropwise to the mixture in the flask over a period of 4 hours, and then the resultant was kept for 2 hours at 80° C. while stirring. Subsequently, solution b was added dropwise to the mixture in the flask at constant speed over a period of 10 minutes, and then the resultant was kept for 3 hours at 80° C. while stirring. The solution in the flask was then heated to 90° C. over a period of 30 minutes. The resultant was kept for 2 hours at 90° C. and then cooled to room temperature, stopped stirring, thereby obtaining a solution of a binder polymer (A-1). In the present specification, the term "room temperature" means 25° C.

With regard to the binder polymer (A-1), the non-volatile content (solid content) was 41.2% by mass, the weight-average molecular weight was 28,000, the acid value was 176 mgKOH/g, and the dispersivity was 1.7.

The weight-average molecular weight was measured by gel permeation chromatography (GPC) and calculation was performed using a standard polystyrene calibration curve. The GPC conditions were as follows.

GPC Conditions
Pump: Hitachi L-6000 (manufactured by Hitachi, Ltd.)
Column: the following three columns, column specifications: 10.7 mmΦ×300 mm
Gelpack GL-R440;
Gelpack GL-R450; and
Gelpack GL-R400M (all manufactured by Hitachi Chemical Co., Ltd)
Eluent: tetrahydrofuran (THF)
Sample concentration: 120 mg of the binder polymer solution with a solid content of 41.2% by mass was measured off and dissolved in 5 mL of THF to prepare a sample
Measuring temperature: 40° C.
Charged amount: 200 μL
Pressure: 49 Kgf/cm$^2$ (4.8 MPa)
Flow rate: 2.05 mL/min
Detector: Hitachi L-3300 R1 (manufactured by Hitachi, Ltd.)

Synthesis of Binder Polymers (A-2) and (A-3)

Each of solutions of binder polymer (A-2) and (A-3) was obtained in a manner similar to the method for obtaining the solution of the binder polymer (A-1), except that materials shown in Table 1 was used as the polymerizable monomers (monomers) in amounts shown in Table 1.

Synthesis of Comparative Binder Polymers (A-4)

A solution of binder polymer (A-4) was obtained in a manner similar to the method for obtaining the solution of the binder polymer (A-1), except that 81 g of methacrylic acid, 15 g of methyl methacrylate, 135 g of styrene, and 69 g of benzyl methacrylate (mass ratio: 27/5/45/23) as polymerizable monomers (monomers) were mixed with 1.0 g of azobisisobutyronitrile to obtain a solution as "solution c", and the solution c was used instead of the solution a.

Synthesis of Comparative Binder Polymers (A-5)

A solution of binder polymer (A-4) was obtained in a manner similar to the method for obtaining the solution of the binder polymer (A-1), except that 72 g of methacrylic acid, 15 g of butyl methacrylate, 135 g of styrene, and 78 g of benzyl methacrylate (mass ratio: 24/5/45/26) as polymerizable monomers (monomers) were mixed with 1.5 g of azobisisobutyronitrile to obtain a solution as "solution d", and the solution d was used instead of the solution a.

With regard to the binder polymers (A-1) to (A-3) and comparative binder polymers (A-4) and (A-5), the mass ratio (%) of the polymerizable monomers (monomers), the acid value, the weight-average molecular weight, and the dispersivity are shown in Table 1.

(B) Photopolymerizable Compound
FA-324M: 2,2-bis(4-(methacryloxydiethoxy)phenyl)propane ("FA-324M", manufactured by Hitachi Chemical Co., Ltd)
FA-3200MY: 2,2-bis(4-(methacryloxyethoxypropoxy) phenyl)propane (an adduct of an average of 12 moles of ethyleneoxide and an average of 4 moles of propyleneoxide) ("FA-3200MY", manufactured by Hitachi Chemical Co., Ltd)
FA-023M: EO, PO-modified polypropyleneglycol #700 dimethacrylate ("FA-023M", manufactured by Hitachi Chemical Co., Ltd, comparative photopolymerizable compound)

(C) Photopolymerization Initiator
B-CIM: 2,2'-bis(2-chlorophenyl)-4,4',5,5'-tetraphenylbisimidazole (2-(2-chlorophenyl)-4,5-diphenylimidazole dimer ("B-CIM", manufactured by Hampford Co.)

(D) Sensitizing Dye
PYR-1: 1-phenyl-3-(4-methoxystyryl)-5-(4-methoxyphenyl)pyrazoline ("PYR-1" manufactured by Nippon Chemical Industrial Co., Ltd.)

(E) Hydrogen Donor
LCV: Leuco crystal violet ("LCV", manufactured by Yamada Chemical Co., Ltd.)

Dye
MKG: Malachite Green ("MKG", manufactured by Osaka Organic Chemistry, Ltd.)

TABLE 2

|   | Component | Example 1 | Example 2 | Example 3 |
|---|---|---|---|---|
| (A) | (A-1) | 51 | — | — |
|   | (A-2) | — | 51 | — |
|   | (A-3) | — | — | 51 |
|   | (A-4) | — | — | — |
|   | (A-5) | — | — | — |
| (B) | FA-324M | 29 | 29 | 29 |
|   | FA-3200MY | 20 | 20 | 20 |
|   | FA-023M | — | — | — |
| (C) | B-CIM | 4 | 4 | 4 |
| (D) | PYR-1 | 0.1 | 0.1 | 0.1 |
| (E) | LCV | 0.65 | 0.65 | 0.65 |
| Dye | MKG | 0.03 | 0.03 | 0.03 |

TABLE 3

|   | Component | Comparative Example 1 | Comparative Example 2 | Comparative Example 3 |
|---|---|---|---|---|
| (A) | (A-1) | — | — | 51 |
|   | (A-2) | — | — | — |
|   | (A-3) | — | — | — |
|   | (A-4) | 51 | — | — |
|   | (A-5) | — | 51 | — |
| (B) | FA-324M | 29 | 29 | — |
|   | FA-3200MY | 20 | 20 | — |
|   | FA-023M | — | — | 50 |

TABLE 1

|   | Methacrylic acid | 2-hydroxyethyl methacrylate | Styrene | Benzyl methacrylate | Methyl methacrylate | Butyl methacrylate | Acid value (mg/KOH) | Weight-average molecular weight | Dispersivity |
|---|---|---|---|---|---|---|---|---|---|
| (A-1) | 27 | 5 | 45 | 23 | 0 | 0 | 176 | 28000 | 1.7 |
| (A-2) | 24 | 5 | 50 | 21 | 0 | 0 | 157 | 26000 | 1.7 |
| (A-3) | 20 | 15 | 50 | 15 | 0 | 0 | 131 | 28000 | 1.7 |
| (A-4) | 27 | 0 | 45 | 23 | 5 | 0 | 176 | 44000 | 2.2 |
| (A-5) | 24 | 0 | 45 | 26 | 0 | 5 | 157 | 26000 | 1.7 |

TABLE 3-continued

|   | Component | Comparative Example | | |
|---|---|---|---|---|
|   |   | 1 | 2 | 3 |
| (C) | B-CIM | 4 | 4 | 4 |
| (D) | PYR-1 | 0.1 | 0.1 | 0.1 |
| (E) | LCV | 0.65 | 0.65 | 0.65 |
| Dye | MKG | 0.03 | 0.03 | 0.03 |

Manufacture of Photosensitive Element

Each of the solutions of photosensitive resin composition obtained above was applied onto a polyethylene terephthalate film with a thickness of 16 μm ("FB-40", manufactured by Toray Industries, Inc.) (support) and subsequently dried at 70° C. and 110° C. with a hot air current drier, thereby forming a photosensitive resin composition layer with a post-drying thickness of 25 μm. A polypropylene film ("E-200K", manufactured by Oji Paper Co., Ltd.) (protective layer) was attached onto the photosensitive resin composition layer, thereby obtaining a photosensitive element including the support, the photosensitive resin composition layer, and the protective layer layered in this order.

Manufacture of Multilayer Substrate

The copper-clad laminate ("MCL-E-679F", manufactured by Hitachi Chemical Co., Ltd.) including a glass epoxy material and a copper foil (thickness: 16 μm) formed on both sides thereof (hereinafter, also referred to as "substrate") was heated to raise the temperature to 80° C. Subsequently, using each of the photosensitive elements of Examples 1 to 3 and Comparative Examples 1 to 3, the photosensitive layer was layered (laminated) on the copper surface of the substrate. The lamination was accomplished under conditions with a temperature of 120° C. and a lamination pressure of 4 kgf/cm$^2$ (0.4 MPa) while removing the protective film, such that the photosensitive resin composition layer of each photosensitive element was closely bonded to the copper surface of the substrate. Thus, a multilayer substrate including the photosensitive resin composition layer and the support layered on the copper surface of the substrate was obtained.

The obtained multilayer substrate was allowed to cool to 23° C. Subsequently, a phototool having a 41-step tablet with a density region of from 0.00 to 2.00, a density step of 0.05, a tablet size of 20 mm×187 mm, and a size of each step of 3 mm×12 mm, was arranged on the support of the multilayer substrate. A direct writing exposure machine ("DE-1UH", manufactured by Hitachi Via Mechanicals, Ltd.) employing a violet laser diode with a wavelength of 405 nm as the light source was used for exposure of the photosensitive resin composition layer through the phototool and the support, at an energy dose (exposure dose) of 100 mJ/cm$^2$. The measurement of illuminance was performed using an ultraviolet illuminometer employing a 405 nm-responding probe ("UIT-150", manufactured by Ushio Inc.).

Evaluation of Sensitivity

Following the exposure, the support was released from the multilayer substrate to lay bare the photosensitive resin composition layer, and 1% by mass aqueous sodium carbonate at 30° C. was sprayed for 60 seconds thereto, thereby removing unexposed areas. Thus a resist pattern including a cured photosensitive resin composition on the copper surface of the substrate was formed. The number of remaining steps of the step tablet (step number) obtained as the resist pattern (cured film) was then counted to evaluate the sensitivity of the photosensitive resin composition. The sensitivity is represented as the step number, with a greater number of steps indicating more satisfactory sensitivity. The results are shown in Tables 4 and 5.

Evaluation of Resolution and Adhesiveness

A drawing with a line width (L)/space width (S) (hereinafter, referred to as "L/S") of from 3/3 to 30/30 (units: μm) was used for exposure (drawing) of the photosensitive resin composition layer on the multilayer substrate at an energy dose for 16 steps remaining on the 41-step tablet. Following the exposure, developing treatment was carried out in the same manner as for the evaluation of sensitivity described above.

After the development, the resolution and adhesiveness were evaluated by the minimum value among the line width/space width values for resist patterns with cleanly removed space areas (unexposed areas), and without meandering or defecting of the line areas (exposed areas). A smaller numerical value indicates more satisfactory resolution and adhesiveness. The results are shown in Tables 4 and 5.

<Evaluation of Developability>

The developability of a photosensitive resin composition layer was evaluated by measuring a minimum development time (seconds) as follows. The above-described multilayer substrate was cut into a square 5 cm on each side and this was used as a specimen for the evaluation of developability. After releasing the support from the specimen, an unexposed photosensitive layer was spray-developed under a pressure of 0.15 MPa using a 1% by mass aqueous sodium carbonate solution at 30° C., and the minimum time that allowed the removal of an unexposed portion of 1 mm or more to be visually confirmed was defined as a minimum development time. The nozzle used was of a full-cone type. The distance between the specimen and the nozzle tip was 6 cm and the specimen was disposed in such a manner that the center of the specimen would coincide with the center of the nozzle. Regarding the minimum development time, a shorter time indicates better developability. The results are shown in Tables 4 and 5.

<Evaluation of Flexibility>

The flexibility of a resist pattern was evaluated as follows. An FPC (flexible printed circuit) substrate (manufactured by Nikkan Industries Co., Ltd., "F-30VC1", substrate thickness: 25 μm, copper thickness: 18 μm) was used. The FPC substrate was heated to 80° C., and then a photosensitive resin composition layer was formed on the FPC substrate by laminating each of the photosensitive elements according to Examples 1 to 3 and Comparative Example 1 to 3 onto the copper surface of the FPC substrate. The lamination was carried out under conditions including a heat roll temperature of 110° C., a lamination speed of 1.5 m/minute, and a lamination pressure of 4 kgf/cm$^2$ (0.4 MPa) with the photosensitive resin composition layer of each of the photosensitive elements facing the FPC substrate while releasing the protective layer. The thus-obtained FPC substrate composed of a photosensitive resin composition layer and a support laminated together was used as a specimen for evaluating flexibility. The specimen was exposed entirely to light at an energy amount in such a way the number of residual steps would become 16 after developing a 41-step tablet by using a direct exposure machine having a blue-violet laser diode with a wavelength of 405 nm as the light source ("DE-1UH" manufactured by Hitachi Via Mechanics, Ltd.) and thus, the photosensitive resin composition layer was photo-cured. Subsequently, after releasing the support, developing was carried out in the same manner as in the above-described evaluation of sensitivity, and thus a substrate for evaluating flexibility in which a cured resist was stacked on one side of the FPC substrate was obtained.

The flexibility was evaluated based on the mandrel test. The substrate for evaluating flexibility was cut into a strip with a width of 2 cm and a length of 10 cm, and then rubbed against a cylindrical bar back and forth 5 times at an angle of 180°. Subsequently, the minimum value among the diameter (mm) of the cylinder without peeling between the FPC substrate and the resist pattern was determined. A smaller diameter of the cylinder indicates more satisfactory flexibility. Evaluation was carried out at diameters of the cylinder of 2, 3, 4, 5, 6, 7, 8, 9, 10, 11, 12, 13, 15 and 20 (unit: mm). A smaller diameter of the cylinder indicates better flexibility. The results are shown in Tables 4 and 5.

TABLE 4

| Item | Example | | |
|---|---|---|---|
| | 1 | 2 | 3 |
| Sensitivity (step number/41) | 14 | 14 | 14 |
| Resolution/Adhesiveness (μm) | 8 | 7 | 9 |
| Minimum developing time (second) | 19 | 18 | 18 |
| Flexibility (Φ, mm) | 8 | 8 | 7 |

TABLE 5

| Item | Comparative Example | | |
|---|---|---|---|
| | 1 | 2 | 3 |
| Sensitivity (step number/41) | 14 | 15 | 15 |
| Resolution/Adhesiveness (μm) | 8 | 8 | 14 |
| Minimum developing time (second) | 28 | 23 | 16 |
| Flexibility (Φ, mm) | 10 | 12 | 6 |

As is clear from Tables 4 and 5, the resist patterns formed from the photosensitive resin compositions including: a binder polymer having a structural unit derived from a (meth)acrylic acid, a structural unit derived from styrene or α-methylstyrene, and a structural unit derived from a hydroxyalkyl (meth)acrylate ester having a hydroxyalkyl group having from 1 to 12 carbon atoms; and a bisphenolic di(meth)acrylate having from 1 to 20 structural units of an ethyleneoxy group and having from 0 to 7 structural units of a propyleneoxy group were excellent in all of resolution, adhesiveness, and flexibility. In addition, the photosensitive resin composition was excellent in developability.

The disclosure of Japanese Patent Application No. 2013-271831 is incorporated herein by reference in its entirety.

All publications, patent applications, and technical standards mentioned in the present specification are herein incorporated by reference to the same extent as if each individual publication, patent application, or technical standard was specifically and individually indicated to be incorporated by reference.

The invention claimed is:

1. A photosensitive resin composition, comprising:
   a binder polymer resulting from the copolymerization of a (meth)acrylic acid, a styrene or α-methylstyrene, a hydroxyalkyl (meth)acrylate ester having a hydroxyalkyl group having from 1 to 12 carbon atoms, and a benzyl (meth)acrylate;
   a photopolymerizable compound including a bisphenolic di(meth)acrylate having from 1 to 20 structural units of an ethyleneoxy group and having from 2 to 7 structural units of a propyleneoxy group; and
   a photopolymerization initiator,
   wherein a content of the bisphenolic di(meth)acrylate having from 1 to 20 structural units of an ethyleneoxy group and having from 2 to 7 structural units of a propyleneoxy group, in the photosensitive resin composition is from 10 parts by mass to 50 parts by mass, with respect to 100 parts by mass of the total amount of the binder polymer and the photopolymerizable compound.

2. A photosensitive element, comprising:
   a support; and
   a photosensitive resin composition layer that is provided on the support and that is formed from the photosensitive resin composition according to claim 1.

3. A method for forming a resist pattern, the method comprising:
   forming a photosensitive resin composition layer on a substrate using the photosensitive resin composition according to claim 1;
   irradiating at least a part of an area of the photosensitive resin composition layer with active light rays and photo-curing the area to form a cured material area; and
   removing an area other than the cured material area of the photosensitive resin composition layer from the substrate to form a resist pattern, which is the cured material area, on the substrate.

4. The method for forming a resist pattern according to claim 3, wherein the active light rays have a wavelength in a range of from 340 nm to 430 nm.

5. A method for producing a printed wiring board, the method comprising:
   subjecting the substrate, on which the resist pattern has been formed using the method for forming a resist pattern according to claim 3, to at least one of etching or plating.

6. The photosensitive resin composition according to claim 1, wherein the photopolymerizable compound has from 3 to 7 structural units of a propyleneoxy group.

7. The photosensitive resin composition according to claim 1, wherein the photopolymerizable compound has from 2 to 5 structural units of a propyleneoxy group.

8. The photosensitive resin composition according to claim 1, wherein the photopolymerizable compound has from 3 to 5 structural units of a propyleneoxy group.

9. The photosensitive resin composition according to claim 1, wherein the binder polymer results from the copolymerization of a (meth)acrylic acid, a styrene or α-methylstyrene, a hydroxyalkyl (meth)acrylate ester having a hydroxyalkyl group having from 1 to 12 carbon atoms, a benzyl (meth)acrylate, and a structural unit derived from an alkyl (meth)acrylate ester.

10. The photosensitive resin composition according to claim 1, wherein the binder polymer comprises methacrylic acid, styrene, 2-hydroxyethyl methacrylate, benzyl methacrylate and methyl methacrylate or butyl methacrylate.

* * * * *